INVENTOR.
MICHAEL J. YARECK
BY
Anthony F. Cuoco
ATTORNEY

Dec. 22, 1970 M. J. YARECK 3,550,022

DIVIDER CIRCUIT

Filed Sept. 4, 1968 3 Sheets-Sheet 2

INVENTOR.
MICHAEL J. YARECK

BY Anthony J. Casella

ATTORNEY

INVENTOR.
MICHAEL J. YARECK
BY Anthony J. Lucas
ATTORNEY

United States Patent Office 3,550,022
Patented Dec. 22, 1970

3,550,022
DIVIDER CIRCUIT

Michael J. Yareck, Staten Island, N.Y., assignor to The Bendix Corporation, a corporation of Delaware
Filed Sept. 4, 1968, Ser. No. 757,248
Int. Cl. G06g *7/16*
U.S. Cl. 328—161 9 Claims

ABSTRACT OF THE DISCLOSURE

A divider including operational amplifiers for providing an oscillator which generates an output having a sawtooth waveform with a duty cycle proportitonal to a first input signal. A second input signal is applied to an amplifier and a switch controlled by the sawtooth waveform gates the amplifier output with the same duty cycle providing a pulse having an amplitude corresponding to the amplifier output and a duty cycle proportional to the first input signal. The switch output is fed back to the amplifier through a negative feedback path for affecting the amplifier output so that it corresponds to the second input signal divided by the first input signal.

CROSS REFERENCE TO RELATED APPLICATIONS

This invention includes a multiplier circuit such as that disclosed and claimed in copending U.S. application Ser. No. 757,237, filed by Michael J. Yareck on Sept. 4, 1968 and assigned to The Bendix Corporation, assignee of the present invention.

BACKGROUND OF THE INVENTION

Field of the invention

This invention relates to divider circuits and, more particularly, to divider circuits having increased accuracy, linearity and stability.

Description of the prior art

When dealing with computing or control systems it is often necessary to divide one signal by another. If the system is, for example, a sophisticated flight control system, accuracy is a paramount consideration.

Heretofore, circuits employing logarithmic or square law devices using non-linear elements have not achieved the required accuracy. Digital techniques have been used but are undesirable because of circuit complexity.

SUMMARY OF THE INVENTION

This invention contemplates a divider circuit including a comparator, an integrator, a voltage controlled switch and a filter. The comparator senses the integrator output and activates the switch as a function thereof. The switch sums a predetermined reference voltage into the integrator driving the integrator output in the reverse direction and closing a loop that provides a free running oscillator generating a sawtooth output having a waveform proportional to a first input signal. A second input signal is applied to an amplifier and the switch gates the amplifier output with the same duty cycle providing a pulse with an amplitude corresponding to the amplifier output and a duty cycle proportional to the first input signal. The switch output is fed back to the amplifier through a negative feedback path for effecting the amplifier output so that is corresponds to the second input signal divided by the first input signal.

One object of this invention is to provide a divider circuit having increased accuracy, linearity and stability.

Another object of this invention is to employ inherent characteristics of operational amplifiers for providing a divider with simplified circuitry.

Another object of this invention is to provide means for generating a sawtooth output as a function of a first input signal and means controlled by the sawtooth output for gating the output of an operational amplifier provided in response to a second input signal through a negative feedback path to the amplifier so that the amplifier output corresponds to the second input signal divided by the first input signal.

Another object of this invention is to combine in a single closed loop system means for generating a sawtooth output to provide a reference and means for comparing an input signal to the reference to provide pulse width modulation.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
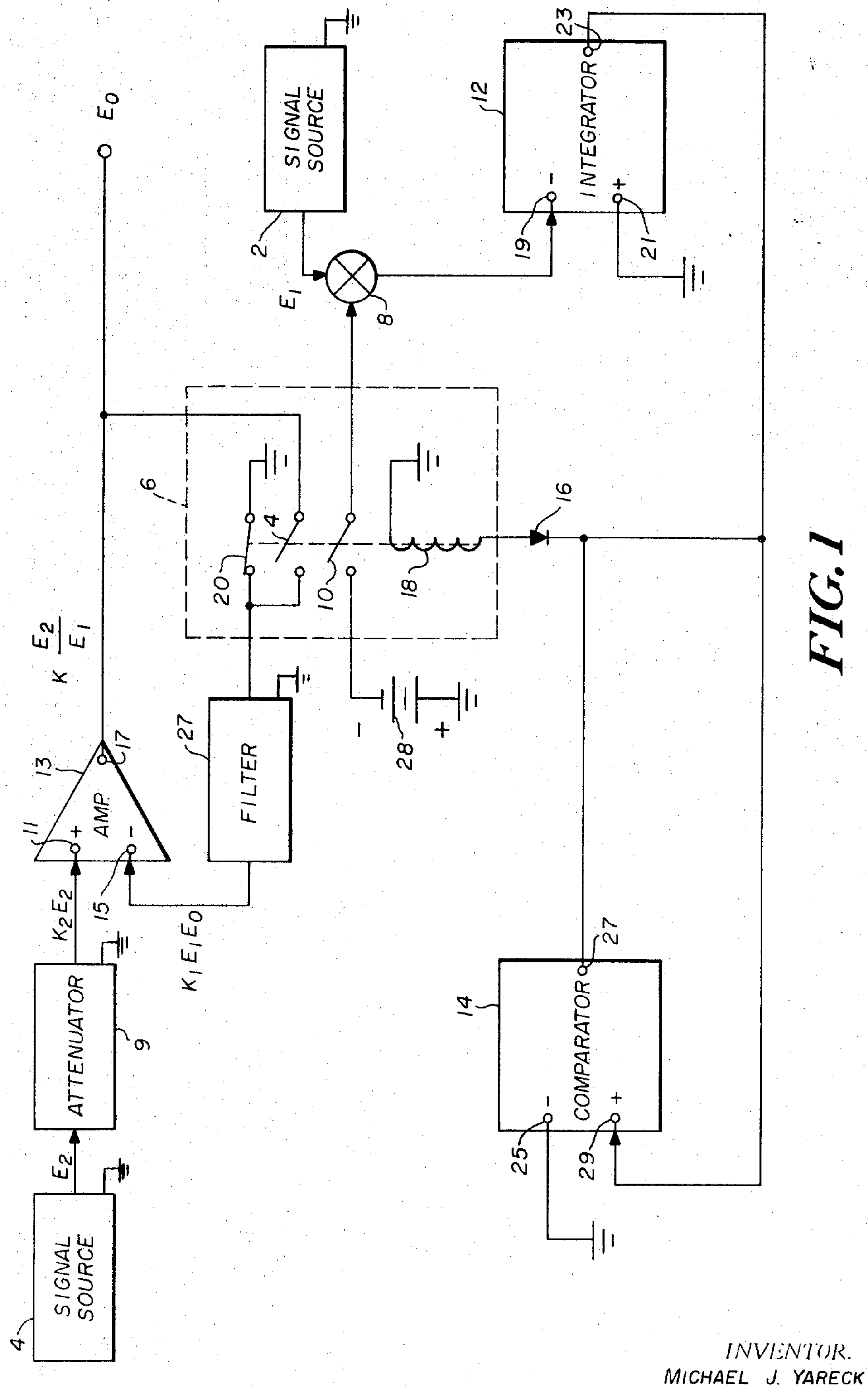
FIG. 1 is a block diagram of the divider of the present invention.

With reference to FIG. 1, a signal source 2 provides a signal $E_1$ and a signal source 4 provides a signal $E_2$. Signals $E_1$ and $E_2$ may correspond for purposes of example to flight condition signals and it is desired to provide a signal corresponding to signal $E_2$ divided by signal $E_1$ for use in a flight control system.

Signal $E_1$ from signal source 2 is applied to a summing means 8 and signal $E_2$ from signal source 4 is applied to an attenuator 9 and therefrom to a non-inverting input 11 of a high gain amplifier 13, and which amplifier 13 has an inverting input 15 and an output 17. Amplifier 13 provides an output $E_0$ at output 17 thereof, and which output is applied to a normally open contact 4 of a switching device 6. A source of negative direct current, such as a battery 28, is connected to a normally open contact 10 of switching device 6, and which normally open contact 10 is connected to summing means 8.

An integrator 12 has an inverting input 19 connected to summing means 8, a grounded non-inverting input 21 and an output 23. The output from integrator 12 at output 23 is applied to a non-inverting input 29 of a comparator 14, and which comparator 14 has a grounded inverting input 25 and an output 27. Comparator 14 compares the polarity of the output from integrator 12 to ground and provides an output at output 27 in accordance therewith which is applied through a diode 16 to a relay 18 included in switching device 6. When relay 18 is energized by the output of comparator 14, as will hereinafter be explained, normally open contacts 4 and 10 of switching device 6 are closed and a grounded normally closed contact 20 of switching device 6 is opened.

When contact 10 of switching device 6 is closed, the negative voltage from battery 28 and signal $E_1$ from signal source 2 are summed by summing means 8 and the summation signal therefrom is applied to inverting input 19 of integrator 12. The output of integrator 12 is driven in a reverse direction and a loop is closed that forms a free running oscillator for providing a waveform as shown in the graphical representation of FIG. 4 at output terminal 23 of integrator 12. As will hereinafter be shown, the duty cycle of the sawtooth waveform of FIG. 4 is linearly proportional to signal $E_1$ from signal source 2.

Figure 3:
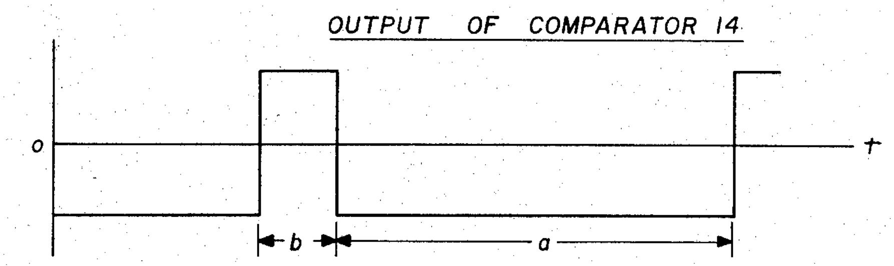
FIG. 3 is a graphical representation showing the waveform of an output from a comparator 14 shown in FIGS. 1 and 2 and provided in accordance with the invention.

The sawtooth output from integrator 12 is applied to comparator 14 at non-inverting input 29 thereof and comparator 14 compares the polarity of this output to ground as heretofore noted providing a pulse having a waveform as shown in the graphical representation of FIG. 3 for operating relay 18 to open and close switch contacts 4, 10 and 20 and to gate signal $E_0$ from the output of amplifier 13.

Figure 2:
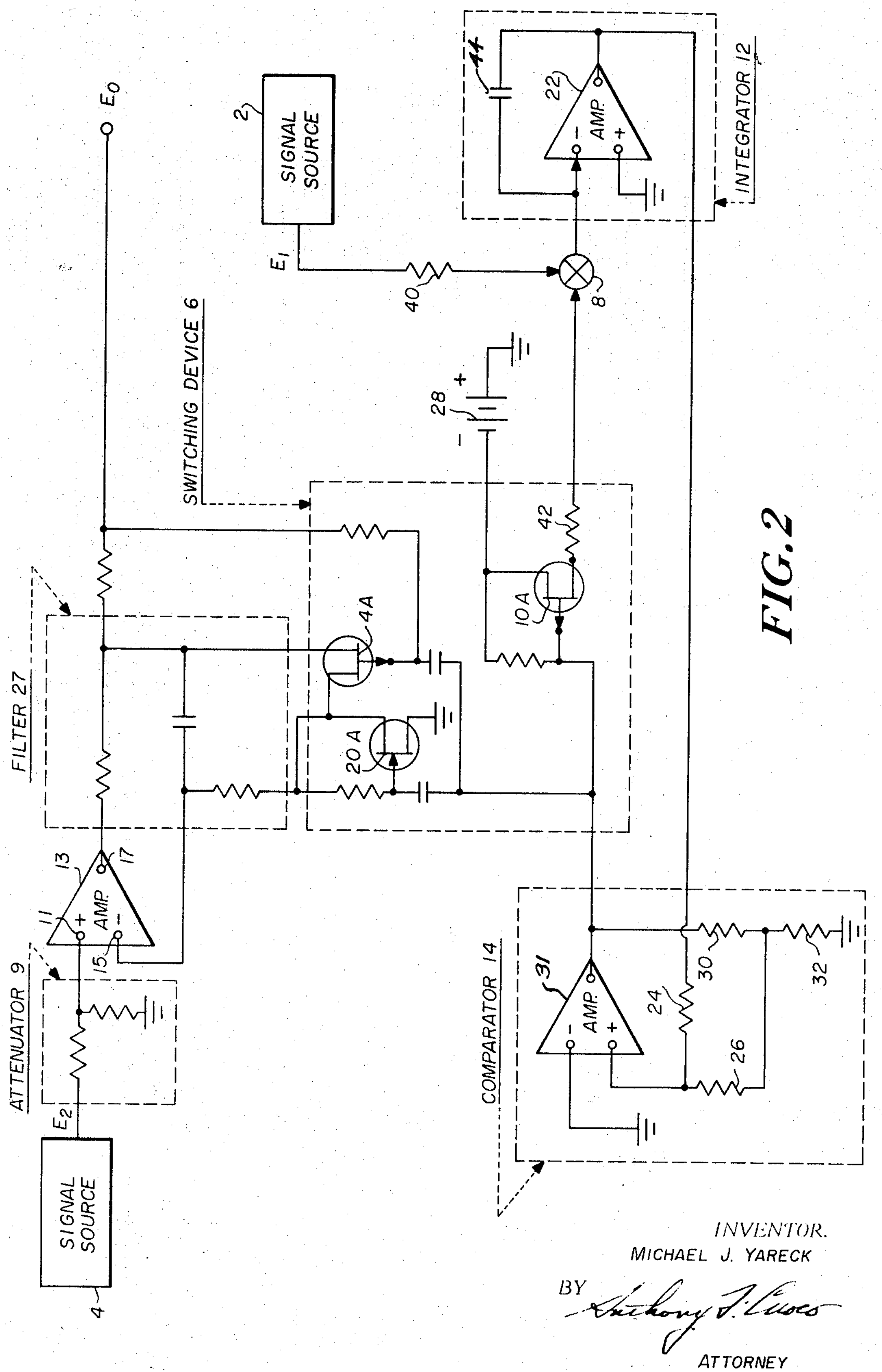
FIG. 2 is an electrical schematic diagram showing in substantial detail the elements of the invention designated generally in the block diagram of FIG. 1.
Figure 5:
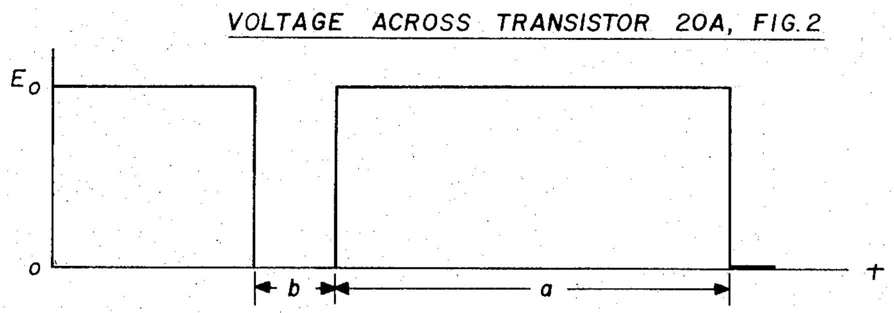
FIG. 5 is a graphical representation of a pulse output from a switching device 6 shown in FIGS. 1 and 2 and provided in accordance with the invention.

When contact 4 of switching device 6 is closed by relay 18, seignal $E_0$ from amplifier 13 is gated with the same duty cycle as the sawtooth output so that the output of switching device 6 is a pulse having a waveform as shown in the graphical representation of FIG. 5. This pulse has an amplitude $E_0$ and duty cycle proportionl to signal $E_1$. The pulse is applied to a filter 27 which provides an output which is the average value of the pulse and therefore proportional to the product of $E_1$ and $E_0$ as shown in copending U.S. application Ser. No. 757,237 filed Sept. 4, 1968. With reference to FIG. 2, switching device 6, filter 27, integrator 12, comparator 14 and attenuator 9 are shown in substantial detail and switch contacts 4, 10 and 20 of switching device 6 are represented as field effect transistors 4A, 10A and 20A, respectively.

Figure 4:
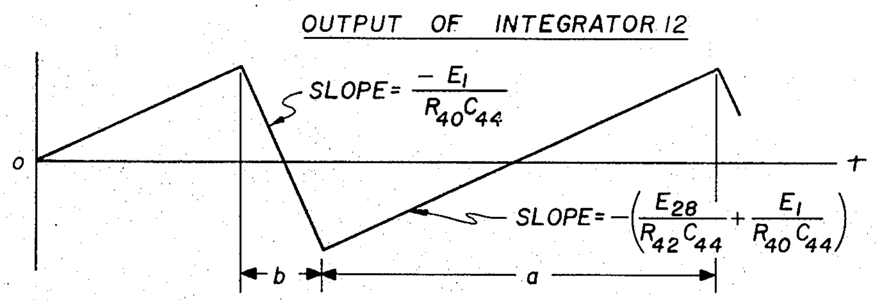
FIG. 4 is a graphical representation of a sawtooth output from an integrator 12 shown in FIGS. 1 and 2 and provided in accordance with the invention.

Thus, the output of an operational amplifier 31 in comparator 14, and which output is the waveform shown in FIG. 3, reverses polarity when the output of an amplifier 22 in integrator 12, and which output is the sawtooth waveform shown in FIG. 4, exceeds the hysteresis level of amplifier 31. The hysteresis level corresponds to the saturation voltage of amplifier 31 multiplied by the ratio of resistors 24, 26, 30 and 32 in the positive feedback path of amplifier 31. Designating the saturation voltage of amplifier 31, as $A_1$, the hysteresis H thereof may be expressed, as follows:

$$H=+A_1\left(\frac{R_{32}}{R_{30}+R_{32}}\right)\left(\frac{R_{24}}{R_{26}+R_{24}}\right) \quad (1)$$

Designating the output of ampliefier 22 as $A_2$, amplifier 31 switches so that its output reverses polarity when the output of amplifier 22 multiplied by the ratio of resistors $R_{24}$ and $R_{26}$ equals the hysteresis of amplifier 14, as follows:

$$A_2\left(\frac{R_{26}}{R_{26}+R_{24}}\right)=\pm H \quad (2)$$

When the output of amplifier 31 is positive, transistor 10A is cutoff, transistor 20A is conductive and transistor 4A is cutoff, and amplifier 22 is driven to negative saturation. In this connection it is noted that signal $E_1$ from signal source 2 is restricted to positive voltages unless a bias is summed into integrator 12 as is obvious to one skilled in the art.

When the output of amplifier 22 reaches the hysteresis level of amplifier 31 as represented by Equation 1, the output of amplifier 31 reverses polarity rendering transistors 10A and 4A conductive and rendering transistor 20A cut off. Integrator 12 is then driven by the summation of the negative voltage from battery 28 and signal $E_1$ from signal source 2. Transistor 20A is thus alternately rendered conductive and non-conductive by the switching of amplifiers 31 and 22 so that the output of switching device 6 across transistor 20A has a waveform as shown in the graphical representation of FIG. 5.

Filter 27 provides an output which is the average value across transistor 20A and is equal to the product of the amplitude of signal $E_0$ and the duty cycle of the waveform shown in the graphical illustration of FIG. 5. This relationship is expressed as follows:

$$E_{27}=E_0\left(\frac{a}{a+b}\right) \quad (3)$$

If the duty cycle $$\left(\frac{a}{a+b}\right)$$

is expressed in terms of the slope of the sawtooth waveform of FIG. 4, and which slope is a function of resistors 40 and 42, capacitor 44 and the voltage from battery 28, it is seen that the output of filter 27 is proportional to the product of signals $E_1$ and $E_0$ and may be expressed as follows:

$$E_{27}=K_1E_1E_0 \quad (4)$$

where $k$ is the proportionality factor.

It is to be noted that the range of voltages $E_1$ for which the divider of the present invention remains in its active region is a function of the relative scaling of resistor 40 connecting signal source 2 to summing means 8 and resistor 42 connecting transistor 10A to summing means 8. The limits of operation of the device occur when the slopes of the sawtooth waveform shown in the graphical illustration of FIG. 4 equal 0.

The output of filter 27 is applied to inverting input 15 of amplifier 13. Amplifier 13 provides signal $E_0$ corresponding to the difference between the signal from attenuator 9 applied to non-inverting input 11 thereof and the output of filter 27 applied to inverting input 15. This output may be represented as follows:

$$E_0=K_2E_2-K_1E_1E_0;\ E_0=\frac{K_2E_2}{1+K_1E_1} \quad (5)$$

and if $K_1$ is considered to be much larger 1, the output $E_0$ of amplifier 13 is as follows:

$$E_0=K\frac{E_2}{E_1} \quad (6)$$

From the foregoing description of the invention, it is seen that a sawtooth oscillator is provided to supply a reference and means are included for comparing signal $E_0$ against this reference to provide pulse width modulation. The sawtooth oscillator and the modulating means are provided in a simple closed loop system. It is also seen that switch 6 is implemented with simplicity since it is responsive to the polarity of the output from integrator 12 and practically no adjustments are required to maintain accuracy of better than $\pm 5\%$ over the temperature range minus 55° C. to 100° C. Additionally, range of input voltages and the proportionality factor K can be changed over a wide range with a minimum change of circuit components.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A divider circuit comprising:

means for providing a first signal;

means for providing a second signal;

means for providing a reference signal;

an integrator for integrating the first signal and for providing an output in one sense;

a comparator for comparing the integrator output to a predetermined voltage level and for providing an output in accordance with said comparison;

an amplifier for amplifying the second signal;

switching means connected to the integrator, to the comparator, to the reference signal means and to the amplifier and responsive to a predetermined comparator output for summing the reference signal into the integrator to drive the integrator output in an opposite sense so that the integrator provides a waveform corresponding to the first signal, and for gating the amplified signal for providing a pulse corresponding to the amplified signal and the first signal; and means for applying said pulse through a negative feedback path to the amplifier to affect the amplifier output so that said output corresponds to the second signal divided by the first signal.

2. A divider circuit as described by claim 1, wherein the comparator includes:

an amplifier having a grounded inverting input terminal, a non-inverting input terminal and an output terminal, a first resistor for connecting the non-inverting input terminal to the integrator so that the amplifier compares the integrator output to ground and provides an output in the one sense when the integrator output is in the one sense;

a second resistor connected to the output and connected to a grounded third resistor;

a fourth resistor connected intermediate the second and third resistors and connected to the non-inverting input terminal; and the amplifier providing an output in the opposite sense when the integrator output exceeds the hysteresis level of the amplifier, said hysteresis level being a function of the first, second, third and fourth resistors.

3. A divider circuit as described by claim 1, wherein:

the amplifier includes a non-inverting input terminal connected to the second signal means, an inverting input terminal connected to the switching means and an output terminal connected to the switching means; and the switching means is responsive to the predetermined capacitor output to gate the amplified signal at the output terminal for providing the pulse corresponding to the amplified signal and the first signal at the inverting input terminal, whereupon the amplifier is responsive to said pulse and to the second signal to provide the amplified output corresponding to the second signal divided by the first signal.

4. A divider circuit as described by claim 1, wherein the switching means includes:

a normally open first switching element connected to the integrator and to the reference signal means;

a normally open second switching element connected to the amplifier in negative feedback configuration;

a normally closed third switching element for connecting the amplifier to ground; and the first, second and third switching elements connected to the comparator and responsive to the predetermined comparator output so that the first switching element is closed to sum the reference signal into the integrator, and the third switching element is opened and the second switching element is closed for gating the amplified signal and for providing the pulse corresponding to the amplified signal and the first signal.

5. A divider circuit as described by claim 1, including:

a filter in the negative feedback path of the amplifier for providing an output corresponding to the product of the amplified signal and the first signal in response to the gated amplified signal.

6. A divider circuit as described by claim 1, wherein:

the waveform provided by the integrator is a sawtooth waveform having a duty cycle proportional to the first signal.

7. A divider circuit as described by claim 1, wherein:

the pulse provided by gating the amplified signal has an amplitude corresponding to the amplified signal and a duty cycle proportional to the first signal.

8. A divider circuit as described by claim 1, wherein the integrator comprises:

an amplifier having a grounded non-inverting input terminal, an inverting input terminal connected to the switching means and to the means for providing a first signal, and an output terminal;

a feedback capacitor connected to the output terminal and to the inverting input terminal; and said capacitor being responsive to the first signal for affecting the amplifier so that there is provided at the output terminal thereof the output in the one sense, and responsive to the first signal and the reference signal when the reference signal is summed into the integrator for affecting the amplifier so that there is provided at the output terminal thereof the output in the opposite sense whereby the amplifier provides the waveform corresponding to the first signal.

9. A divider circuit as described by claim 8, including:

a first resistor for connecting the means for providing a first signal to the non-inverting input terminal of the integrator amplifier;

a second resistor for connecting the switching means to the non-inverting input terminal of the integrator amplifier; and the integrator amplifier output in the one sense increasing linearly in the one sense as a function of the first signal, the feedback capacitor and the first resistor, and the integrator amplifier output in the other sense increasing linearly in the other sense as a function of the first signal, the feedback capacitor, the reference signal and the first and second resistors.

References Cited

UNITED STATES PATENTS

| | | | |
|---|---|---|---|
| 3,309,510 | 3/1967 | Brown | 328—160 |
| 3,458,821 | 7/1969 | Claridge | 328—161 |
| 3,466,460 | 9/1969 | Connolly | 328—160 |

DONAD D. FORRER, Primary Examiner

H. A. DIXON, Assistant Examiner

U.S. Cl. X.R.

307—229, 251